US012740283B2

(12) United States Patent
Zhu et al.

(10) Patent No.: US 12,740,283 B2
(45) Date of Patent: Sep. 15, 2026

(54) TOUCH PANEL AND METHOD FOR MANUFACTURING THE SAME, DISPLAY MODULE

(71) Applicant: Hefei Visionox Technology Co., Ltd., Hefei (CN)

(72) Inventors: Chao Zhu, Hefei (CN); Wenzhi Fan, Hefei (CN); Yao Li, Hefei (CN); Fei Chen, Hefei (CN); Weiqi Xu, Hefei (CN); Fang Zhang, Hefei (CN); Zengbiao Sun, Hefei (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 0 days.

(21) Appl. No.: 19/075,685

(22) Filed: Mar. 10, 2025

(65) Prior Publication Data

US 2025/0212650 A1 Jun. 26, 2025

Related U.S. Application Data

(63) Continuation of application No. PCT/CN2024/097067, filed on Jun. 3, 2024.

(30) Foreign Application Priority Data

Jul. 31, 2023 (CN) ......................... 202310966159.8

(51) Int. Cl.
*G06F 3/03* (2006.01)
*G06F 3/0354* (2013.01)
(Continued)

(52) U.S. Cl.
CPC ......... *H10K 59/40* (2023.02); *G06F 3/03547* (2013.01); *H10K 59/1201* (2023.02); *H10K 59/38* (2023.02); *H10K 2102/311* (2023.02)

(58) Field of Classification Search
CPC .............. A61K 2039/507; C07K 16/10; C07K 2317/13; C07K 2317/14; C07K 2317/21;
(Continued)

(56) References Cited

U.S. PATENT DOCUMENTS

2021/0242283 A1 8/2021 Lee et al.
2021/0365152 A1* 11/2021 Xu ........................ G06F 3/0412

FOREIGN PATENT DOCUMENTS

CN 106898612 A 6/2017
CN 107731869 A 2/2018
(Continued)

OTHER PUBLICATIONS

International Search Report of Application No. PCT/CN2024/097067.
The Office Action issued in Korean corresponding application 10-2025-7003530, mailed on Mar. 19, 2026.

*Primary Examiner* — Insa Sadio
(74) *Attorney, Agent, or Firm* — Kilpatrick Townsend & Stockton LLP

(57) ABSTRACT

The present application discloses a touch panel and method for manufacturing the same, and a display module. The touch panel includes: a touch substrate; and a touch layer, including a touch metal layer and an insulating layer, the touch metal layer being located at one side of the touch substrate, and the insulating layer including a body portion and at least an opening portion; the body portion being located in the same layer as the touch metal layer, or the body portion being located at a side of the touch metal layer away from the touch substrate; the opening portion exposing at least a portion of the touch metal layer.

17 Claims, 13 Drawing Sheets

(51) Int. Cl.
*H10K 59/12* (2023.01)
*H10K 59/38* (2023.01)
*H10K 59/40* (2023.01)
*H10K 102/00* (2023.01)

(58) Field of Classification Search
CPC ............ C07K 2317/55; C07K 2317/56; C07K 2317/76; C07K 2317/92; C07K 2317/94; C12N 15/8258; G06F 3/03547; H10K 2102/311; H10K 59/1201; H10K 59/38; H10K 59/40; G02F 1/1345; G02F 1/13452; G02F 1/13458; G02F 1/136286
See application file for complete search history.

(56) References Cited

FOREIGN PATENT DOCUMENTS

| | | | |
|---|---|---|---|
| CN | 109801955 | A | 5/2019 |
| CN | 110571240 | A | 12/2019 |
| CN | 211479089 | U | 9/2020 |
| CN | 113224117 | A | 8/2021 |
| CN | 114093892 | A | 2/2022 |
| CN | 114242756 | A | 3/2022 |
| CN | 115084410 | A | 9/2022 |
| CN | 116931765 | A | 10/2023 |
| JP | 2006165079 | A | 6/2006 |
| KR | 1020120116225 | A | 10/2012 |
| KR | 1020210010714 | A | 1/2021 |
| KR | 1020220097048 | A | 7/2022 |

* cited by examiner

TOUCH PANEL AND METHOD FOR MANUFACTURING THE SAME, DISPLAY MODULE

CROSS REFERENCE TO RELATED APPLICATION

The present application is a continuation application of International Application No. PCT/CN2024/097067, filed on Jun. 3, 2024, which claims priority to Chinese Patent Application No. 202310966159.8 filed on Jul. 31, 2023, both of which are incorporated herein by reference in their entireties.

FIELD

The present application relates to the field of display technology, and particularly to a touch panel and method for manufacturing the same, and a display module.

BACKGROUND

With the development of display technology, the performance requirement for a display device is getting higher and higher. The display panel in the current display device suffers from the problem of poor bending performance.

SUMMARY

Embodiments of the present application provide a touch panel and method for manufacturing the same, and a display module, which can improve the bending performance of the touch panel.

Some embodiments of a first aspect of the present application provide a touch panel, including: a touch substrate; and a touch layer, including a touch metal layer and an insulating layer, the touch metal layer being located at one side of the touch substrate, and the insulating layer including a body portion and at least an opening portion; the body portion being located in the same layer as the touch metal layer, or the body portion being located at a side of the touch metal layer away from the touch substrate; the opening portion exposing at least a portion of the touch metal layer.

Some embodiments of a second aspect of the present application provide a display module including any touch panel according to the first aspect of the present application.

Some embodiments of a third aspect of the present application provide a method for manufacturing a touch panel, including: providing a touch substrate; and forming a touch layer at one side of the touch substrate, the touch layer including a touch metal layer and an insulating layer, the touch metal layer being located at one side of the touch substrate, the insulating layer including a body portion and at least an opening portion, the body portion being located in the same layer as the touch metal layer, or the body portion being located at a side of the touch metal layer away from the touch substrate, the opening portion exposing at least a portion of the touch metal layer.

The touch panel according to the present application includes a touch substrate and a touch layer formed on the touch substrate. The touch layer includes a touch metal layer and an insulating layer, and the touch metal layer is used to achieve the touch control function. The insulating layer includes a body portion and at least an opening portion, the opening portion exposes at least a portion of the touch metal layer to reduce or eliminate a contact area between the body portion and the touch metal layer, thereby reducing, when the touch panel is bent by a force, the adverse effect of the stress difference in the portion of the body portion in contact with the touch metal layer on the bending performance of the touch panel, for example, the portion of the body portion in contact with the touch metal layer is likely to have a crack, the body portion is likely to peeling off from the touch metal layer due to poor contact between the body portion and the touch metal layer, or the like. The insulating layer facilitates improving the bending performance and yield of the touch panel, and moreover, the provision of the insulating layer facilitates improving the insulating performance of the touch metal layer in a direction perpendicular or parallel to a plane in which the touch substrate is located.

DETAILED DESCRIPTION

Figure 1:
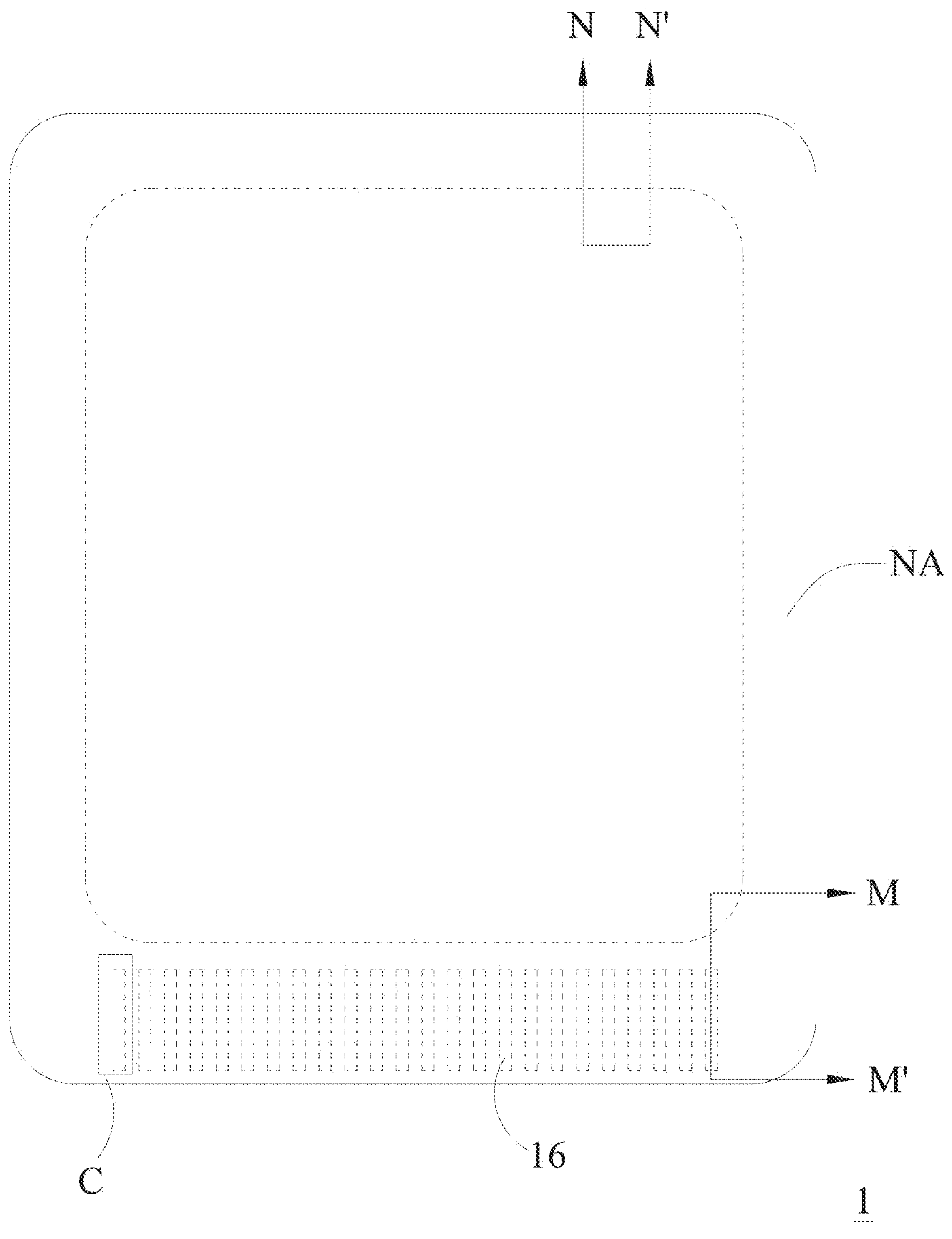
FIG. 1 shows a top view of a touch panel according to embodiments of the present application.

Features and exemplary embodiments of various aspects of the present application are described in detail below. In the following detailed description, a number of specific details are presented in order to provide a full understanding of the present application. However, it is apparent to those skilled in the art that the present application can be implemented without some of these specific details. The following description of embodiments is merely intended to provide a better understanding of the present application by illustrating examples of the application.

The inventors have found, after research, that the main reason for the display device suffering from the problem of poor bending performance is that in the bending process, the touch layer and the film layer in contact with the touch layer have defects such as peeling off and crack, which affect the bending performance of the display device. Based on the study of the above problems, the inventors present a touch panel and method for manufacturing the same, a display module, and a display apparatus, to improve the bending function of the touch panel.

In order to better understand the present application, the touch panel and method for manufacturing the same, and the display module according to the embodiments of the present application are described in detail below in conjunction with FIGS. 1 to 26.

Referring to FIGS. 1-4, the embodiments of the present application provide a touch panel 1 including a touch substrate 11 and a touch layer 12. The touch layer 12 includes a touch metal layer 121 and an insulating layer 122, the touch metal layer 121 is located at one side of the touch substrate 11, and the insulating layer 122 includes a body portion 1221 and at least an opening portion 1222; the body portion 1221 is located in the same layer as the touch metal layer 121, or the body portion 1221 is located at a side of the touch metal layer 121 away from the touch substrate 11; the opening portion 1222 exposes at least a portion of the touch metal layer 121.

The touch panel 1 according to the present application includes a touch substrate 11 and a touch layer 12 formed on the touch substrate 11. The touch layer 12 includes a touch metal layer 121 and an insulating layer 122, and the touch metal layer 121 is used to achieve the touch control function. The insulating layer 122 includes a body portion 1221 and at least an opening portion 1222, the opening portion 1222 exposes at least a portion of the touch metal layer 121 to reduce or eliminate a contact area between the body portion 1221 and the touch metal layer 121, thereby reducing, when the touch panel 1 is bent by a force, the adverse effect of the stress difference in the portion of the body portion 1221 in contact with the touch metal layer 121 on the bending performance of the touch panel 1, for example, the portion of the body portion 1221 in contact with the touch metal layer 121 is likely to have a crack, the body portion 1221 is likely to peeling off from the touch metal layer 121 due to poor contact between the body portion 1221 and the touch metal layer 121, or the like. The insulating layer 122 facilitates improving the bending performance and yield of the touch panel 1, and moreover, the provision of the insulating layer 122 facilitates improving the insulating performance of the touch metal layer 121 in a direction perpendicular or parallel to a plane in which the touch substrate 11 is located.

Figure 2:
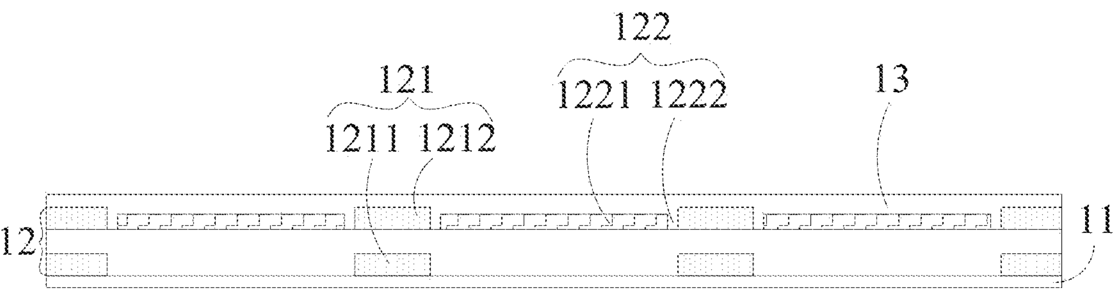
FIG. 2 shows a sectional view along N-N' in FIG. 1.

Specifically, as shown in FIG. 2, the insulating layer 122 may include a plurality of body portions 1221 which are spaced apart and located in the same layer as the touch metal layer 121, an orthographic projection of the body portion 1221 on the touch substrate 11 is separated from an orthographic projection of the touch metal layer 121 on the touch substrate 11, and the opening portion 1222 is located between adjacent body portions 1221. In such cases, the opening portion 1222 completely exposes the touch metal layer 121, and the body portion 1221 is not in contact with the touch metal layer 121, thereby preventing, when the touch panel 1 is bent by a force, the adverse effect of the stress difference in the portion of the body portion 1221 in contact with the touch metal layer 121 on the bending performance of the touch panel 1, and facilitating improving the bending performance and yield of the touch panel 1. Moreover, the insulating layer 122 may provide insulating function along a direction parallel to the plane in which the touch substrate 11 is located.

Figure 3:
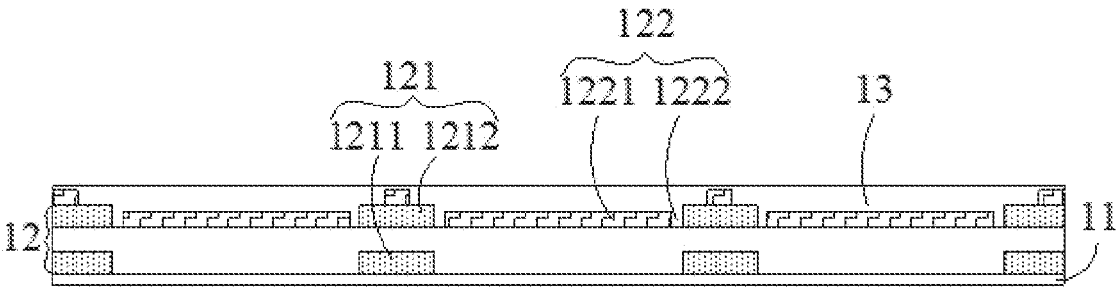
FIG. 3 shows another sectional view along N-N' in FIG. 1.

In one embodiment, as shown in FIG. 3, the body portion 1221 includes a portion located in the same layer as the touch metal layer 121 and a portion located at a side of the touch metal layer 121 away from the touch substrate 11, and the opening portion 1222 is formed in an area corresponding to the portion of the body portion 1221 located at the side of the touch metal layer 121 away from the touch substrate 11. In such cases, the opening portion 1222 exposes a portion of the touch metal layer 121, and the provision of the opening portion 1222 may reduce the contact area between the body portion 1221 and the touch metal layer 121, thereby reducing, when the touch panel 1 is bent by a force, the adverse effect of the stress difference in the portion of the body portion 1221 in contact with the touch metal layer 121 on the bending performance of the touch panel 1, and facilitating improving the bending performance and yield of the touch panel 1. Moreover, the insulating layer 122 may provide insulating function along a direction parallel to the plane in which the touch substrate 11 is located.

Figure 4:
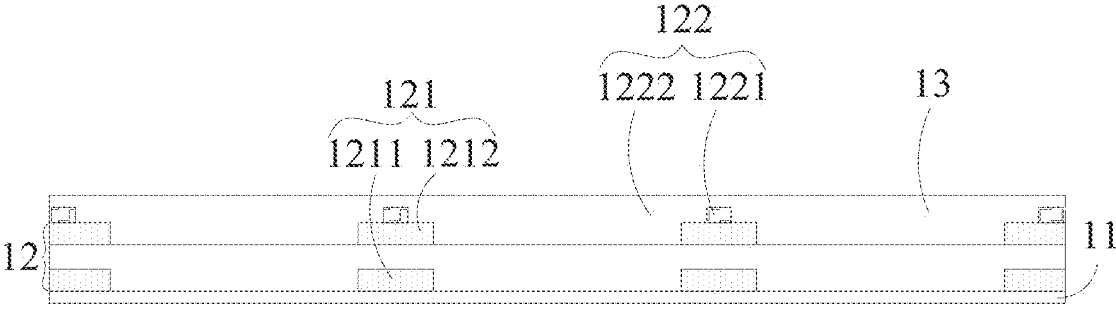
FIG. 4 shows another sectional view along N-N' in FIG. 1.

In one embodiment, as shown in FIG. 4, the body portion 1221 includes only a portion located at a side of the touch metal layer 121 away from the touch substrate 11. In such cases, the body portion 1221 is in contact with the touch metal layer 121, but the opening portion 1222 exposes at least a portion of the touch metal layer 121, to reduce the contact area between the body portion 1221 and the touch metal layer 121, thereby reducing, when the touch panel 1 is bent by a force, the adverse effect of the stress difference in the portion of the body portion 1221 in contact with the touch metal layer 121 on the bending performance of the touch panel 1, and facilitating improving the bending performance and yield of the touch panel 1.

In one embodiment, as shown in FIGS. 2-4, the touch panel 1 further includes a protective layer 13 located at a side of the touch layer 12 away from the touch substrate 11, and an orthographic projection of the protective layer 13 on the touch substrate 11 at least covers an orthographic projection of the touch metal layer 121 on the touch substrate 11.

Specifically, the protective layer 13 being located at the side of the touch layer 12 away from the touch substrate 11 includes: the protective layer 13 is located at a side of the touch metal layer 121 away from the touch substrate 11, or the protective layer 13 is located at a side of the insulating layer 122 away from the touch substrate 11, or both.

In the above implementation, the protective layer 13 is arranged at the side of the touch layer 12 away from the touch substrate 11, and the orthographic projection of the protective layer 13 on the touch substrate 11 at least covers the orthographic projection of the touch metal layer 121 on the touch substrate 11, which helps to cover and protect the portion of the touch metal layer 121 that is exposed through the opening portion 1222 in the insulating layer 122 and prevent the adverse effect of subsequent film layers on the touch metal layer 121, thereby facilitating improving the yield and reliability of the touch metal layer 121.

In one embodiment, the orthographic projection of the protective layer 13 on the touch substrate 11 covers an orthographic projection of the touch layer 12 on the touch substrate 11, i.e., the protective layer 13 covers the entire surface.

In the above implementation, the orthographic projection of the protective layer 13 on the touch substrate 11 further covers the orthographic projection of the body portion 1221 on the touch substrate 11, and the body portion 1221 can be protected by the protective layer 13, and moreover, the protective layer 13 can be prepared as a whole layer without the need of patterning, to save the preparation process.

Figure 5:
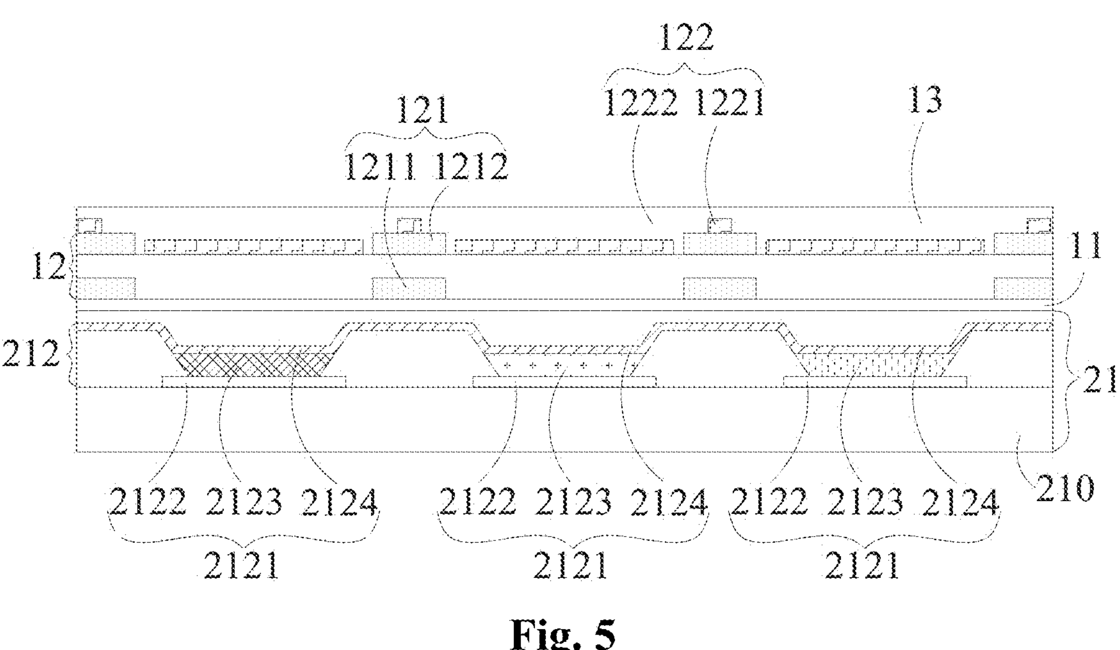
FIG. 5 shows a schematic structural diagram of a touch panel according to embodiments of the present application in use.

As shown in FIG. 5, the touch panel 1 is generally assembled to the light-emitting side of the display panel 21 in use. The display panel 21 includes an array base plate 210 and a light-emitting layer 212, the light-emitting layer 212 is located at a side of the array base plate 210 towards the touch panel 1 and includes a plurality of light-emitting units 2121, and the light-emitting unit 2121 includes a first electrode 2122, a light-emitting functional layer 2123, and a second electrode 2124 that are stacked along a direction away from the array base plate 210.

In one embodiment, the protective layer 13 includes an organic material, which may be prepared, for example, by using photoresist (OC).

In the above implementation, the protective layer 13 includes an organic material, which has better flexibility and ductility and is less likely to cause, in contact with the touch layer 12, peeling off and crack in the bending process, thereby providing effective protection for the touch layer 12, and moreover, the protective layer 13 may provide a flat surface at the side away from the touch substrate 11, to facilitate the preparation of subsequent film layers.

Figure 6:
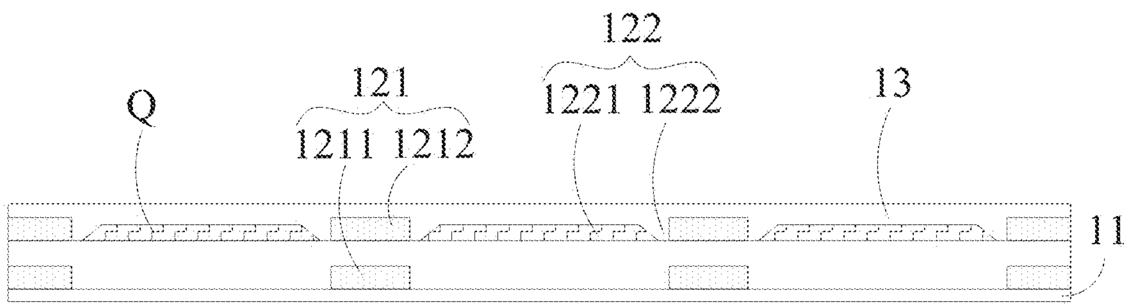
FIG. 6 shows another sectional view along N-N' in FIG. 1.
Figure 7:
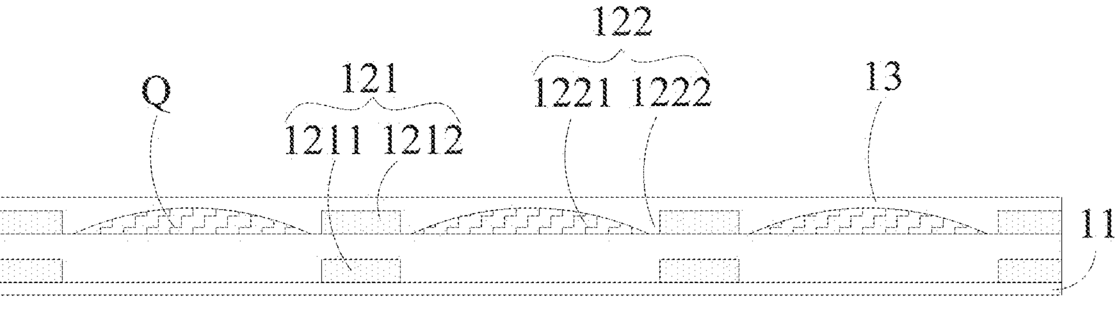
FIG. 7 shows another sectional view along N-N' in FIG. 1.

In one embodiment, as shown in FIG. 6, the body portion 1221 includes a first cross-section Q in a direction perpendicular to the plane in which the touch substrate 11 is located, the first cross-section Q is a trapezoid in shape, or as shown in FIG. 7, an edge of the first cross-section Q at a side away from the touch substrate 11 is an arc in shape.

In the above implementation, the body portion 1221 may include block structures corresponding to the light-emitting units 2121 in one-to-one correspondence, to adjust the light-emitting units 2121 independently. In one embodiment, an orthographic projection of a plurality of body portions 1221 on the array base plate 210 is located within an orthographic projection of one light-emitting unit 2121 on the array base plate 210.

The body portion 1221 includes the first cross-section Q in the direction perpendicular to the plane in which the touch substrate 11 is located, the first cross-section Q is a trapezoid in shape, or the edge of the first cross-section Q at the side away from the touch substrate 11 is an arc in shape, and the body portion 1221 may be formed as a convex lens structure to concentrate light and further increase the light exitance along the direction perpendicular to the plane in which the touch substrate 11 is located, and thus a portion of the large-angle lights may be emitted, after being concentrated, along the direction perpendicular to the plane in which the touch substrate 11 is located, to increase the exitance of the light emitted by the light-emitting unit 2121, thereby reducing the power consumption of the display panel 21. Moreover, the trapezoidal or arc may increase the contact area between the body portion 1221 and the protective layer 13 to further increase the connection strength between the body portion 1221 and the protective layer 13.

Figure 8:
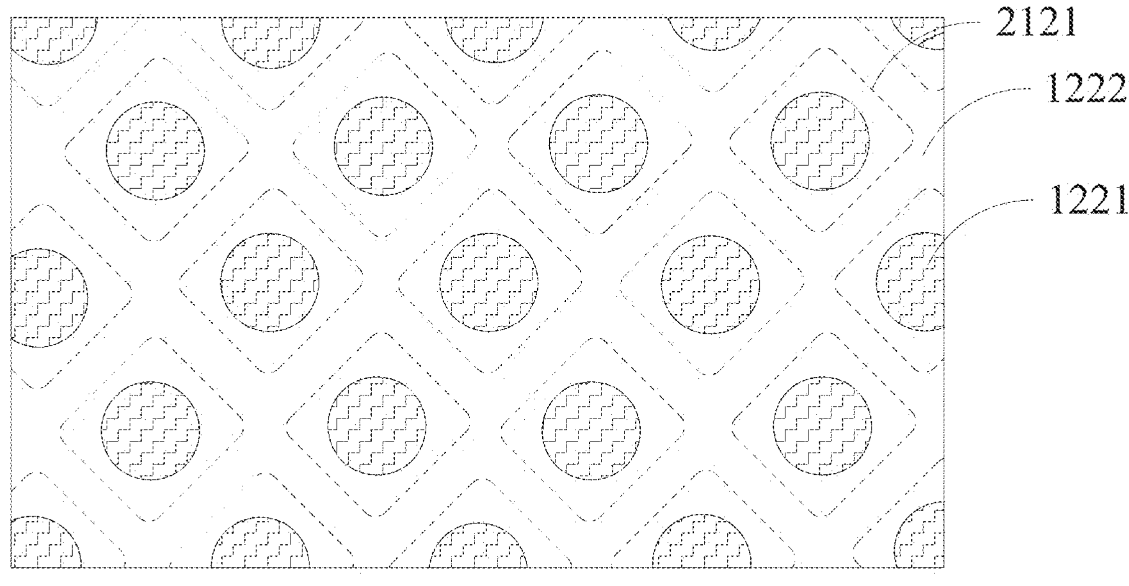
FIG. 8 shows a partial schematic view of a touch panel according to embodiments of the present application.
Figure 9:
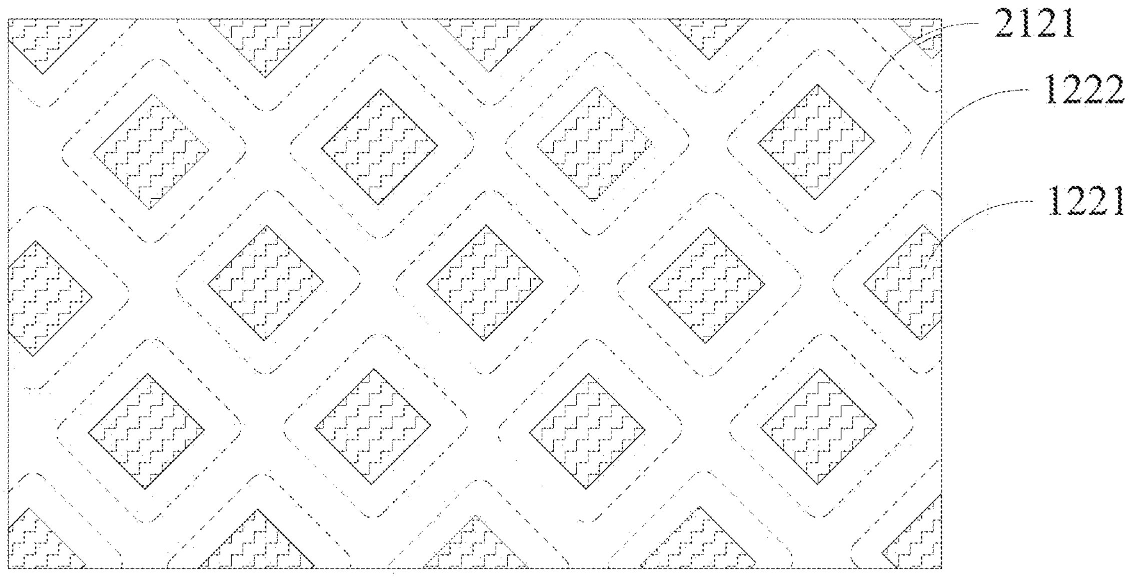
FIG. 9 shows a partial schematic view of another touch panel according to embodiments of the present application.

In one embodiment, as shown in FIGS. 8 and 9, an orthographic projection of the body portion 1221 on the touch substrate 11 is a circle or rectangular in shape.

In the above implementation, the orthographic projection of the body portion 1221 on the touch substrate 11 is a circle or rectangular in shape, on the one hand, the adoption of regular shapes may facilitate the preparation, and on the other hand, the body portion 1221 of a suitable shape may be selected according to the actual shape of the light-emitting unit 2121, to improve the light-emitting effect of the display panel 21.

Figure 10:
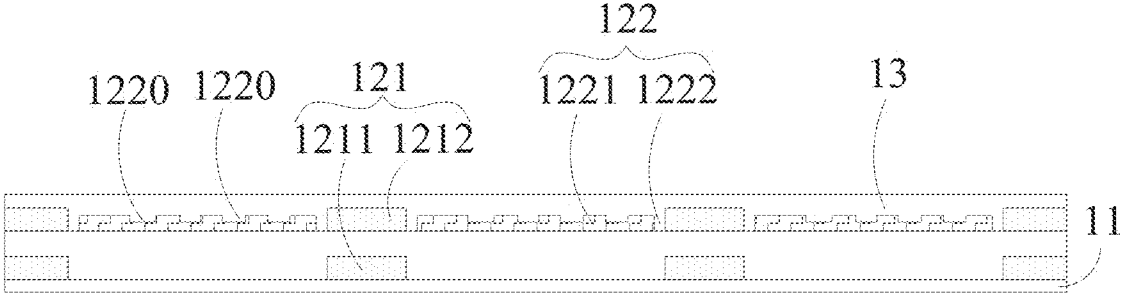
FIG. 10 shows another sectional view along N-N' in FIG. 1.

In one embodiment, as shown in FIG. 10, the body portion 1221 includes a recess structure 1220 formed at a surface of the body portion 1221 at a side away from the touch substrate 11, and the protective layer 13 extends into the recess structure 1220.

In the above implementation, the body portion 1221 includes the recess structure 1220 formed by recessing the surface of the body portion 1221 at the side away from the touch substrate 11 towards the side close to the touch substrate 11. The protective layer 13 extends into the recess structure 1220 to increase the contact area and contact depth between the protective layer 13 and the body portion 1221, to increase the bonding force between the protective layer 13 and the body portion 1221 and reduce the probability of peeling off between the protective layer 13 and the body portion 1221 in the bending process of the touch panel 1, thereby further increasing the stability of the structure and the yield of the touch panel 1.

Figure 11:
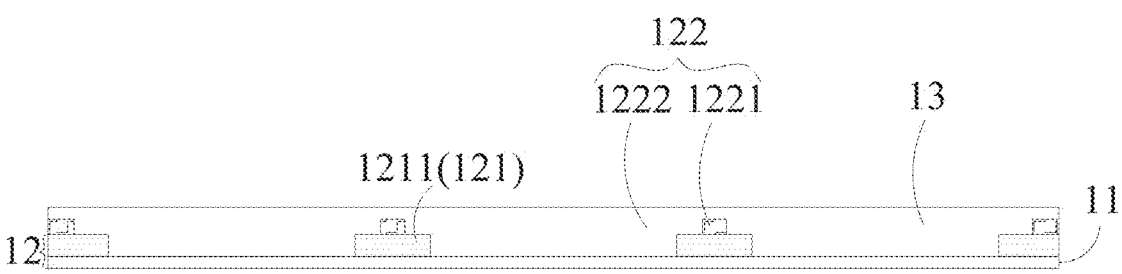
FIG. 11 shows another sectional view along N-N' in FIG. 1.

In one embodiment, as shown in FIG. 11, the touch metal layer 121 is a first touch metal layer 1211, i.e., the touch metal layer 121 includes only one layer of metal.

Figure 12:
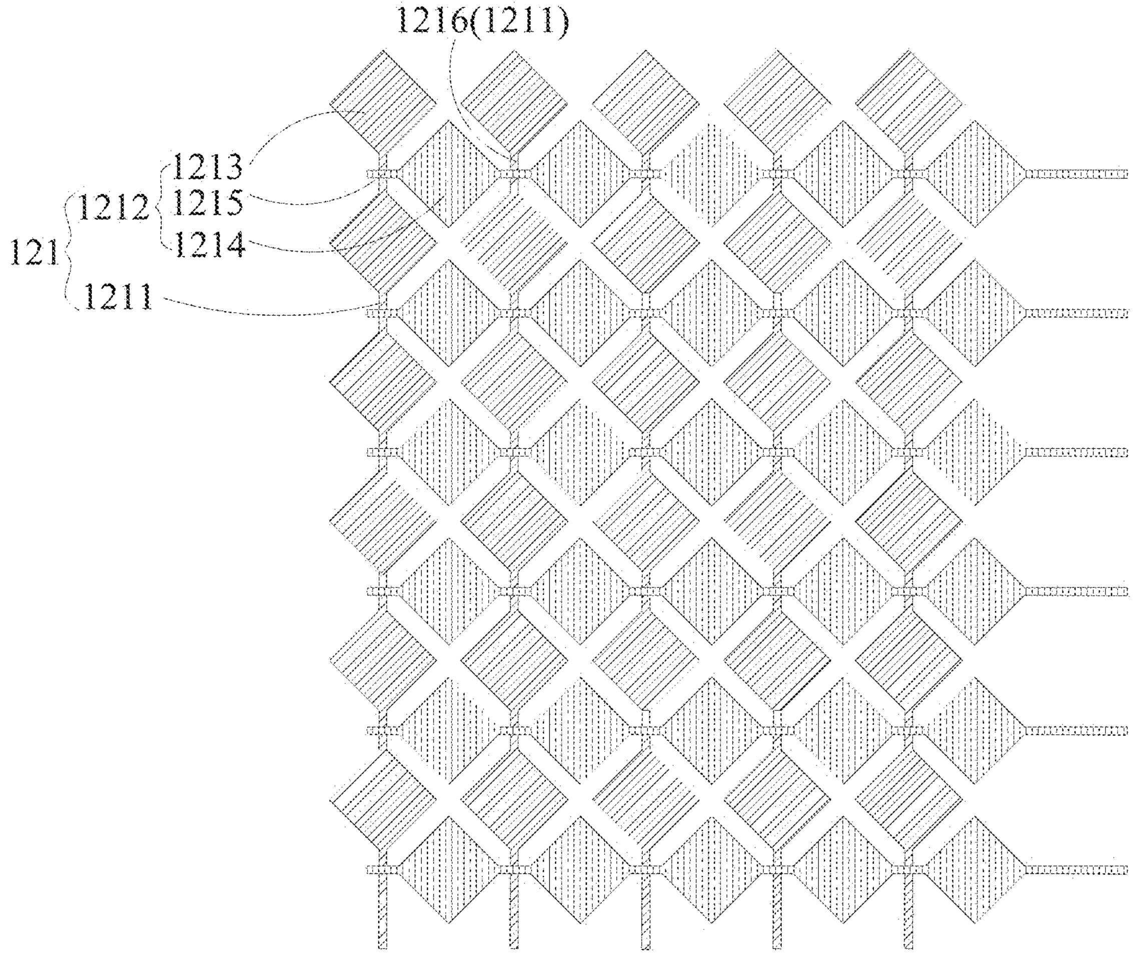
FIG. 12 shows a partial schematic view of a touch panel according to embodiments of the present application.

In another possible implementation, as shown in FIG. 12, the touch metal layer 121 includes a first touch metal layer 1211 and a second touch metal layer 1212, the first touch metal layer 1211 includes a first touch wiring 1216, the second touch metal layer 1212 includes a plurality of first touch electrodes 1213, a plurality of second touch electrodes 1214, and a second touch wiring 1215, the first touch electrodes 1213 are distributed in rows and columns, the first touch electrodes 1213 adjacent along a column direction are electrically connected through the first touch wiring 1216, and the second touch electrodes 1214 are distributed in rows and columns, the second touch electrodes 1214 adjacent along a row direction are electrically connected through the second touch wiring 1215.

In the above implementation, the first touch electrodes 1213 may be distributed in the row and column directions, the second touch electrodes 1214 may be distributed in the row and column directions, and the first touch electrodes 1213 and the second touch electrodes 1214 may be staggered along the row and column directions, to achieve a greater density of touch detection.

Figure 13:
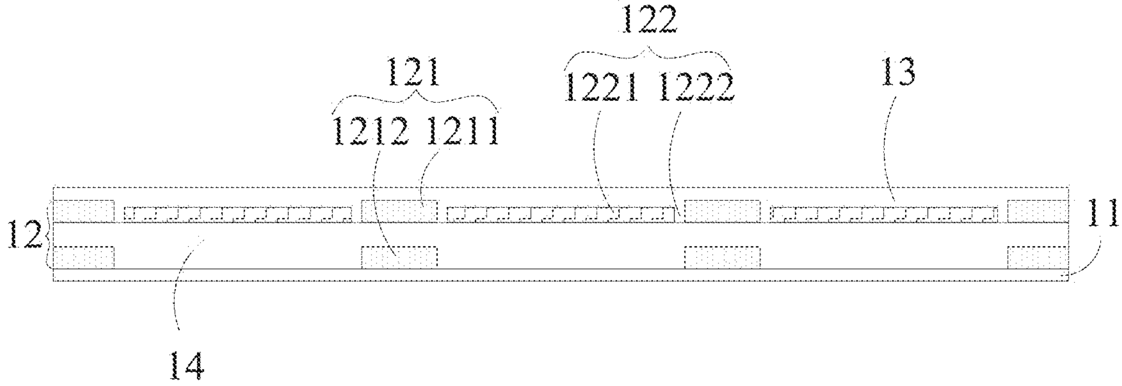
FIG. 13 shows another sectional view along N-N' in FIG. 1.

Specifically, as shown in FIGS. 2 and 12, the second touch metal layer 1212 is located at a side of the first touch metal layer 1211 away from the touch substrate 11, or as shown in FIG. 13, the first touch metal layer 1211 is located at a side of the second touch metal layer 1212 away from the touch substrate 11, which is not limited in the present application.

In one embodiment, the opening portion 1222 exposes at least an edge of the touch metal layer 121, and after the touch metal layer 121 is in contact with a material of less ductility at the edge position, when bending occurs, the stress difference between the touch metal layer 121 and the material is large, and thus peeling off, warping, and other problems are likely to occur. If the opening portion 1222 exposes the edge of the touch metal layer 121, the insulating layer 122 may be not in contact with the edge of the touch metal layer 121, thereby reducing the poor contact between the insulating layer 122 and the touch metal layer 121 due to a large stress difference between the insulating layer 122 and the touch metal layer 121 in the bending process, and thus the bending effect is improved.

Specifically, if the second touch metal layer 1212 is located at a side of the first touch metal layer 1211 away from the touch substrate 11, the opening portion 1222 exposes at least an edge of the second touch metal layer 1212.

Herein, the second touch metal layer 1212 is patterned to form the first touch electrodes 1213, the second touch electrodes 1214, and the second touch wiring 1215, and the insulating layer 122 is more likely to have defects, at the edge position of the patterned structure in the second touch metal layer 1212, after being for example bent or folded by a force. Therefore, the opening portion 1222 exposes at least the edge of the second touch metal layer 1212 to reduce the contact area between the second touch metal layer 1212 and the insulating layer 122 and avoid contact with the area where bending generates greater stress, thereby reducing the probability of defects after bending, to reduce the poor contact between the insulating layer 122 and the second touch metal layer 1212 due to a large stress difference between the insulating layer 122 and the second touch metal layer 1212 in the bending process, and thus the bending performance of the touch panel 1 is improved.

Specifically, if the first touch metal layer 1211 is located at a side of the second touch metal layer 1212 away from the touch substrate 11, the opening portion 1222 exposes at least an edge of the first touch metal layer 1211, thereby reducing the poor contact between the insulating layer 122 and the first touch metal layer 1211 due to a large stress difference between the insulating layer 122 and the first touch metal layer 1211 in the bending process, and thus the bending effect is improved. Moreover, since the first touch metal layer 1211 includes only the first touch wiring 1216, and the second touch metal layer 1212 includes the first touch electrodes 1213, the second touch electrodes 1214, and the second touch wiring 1215, the second touch metal layer 1212 has a larger area than the first touch metal layer 1211 and thus has a greater adverse effect on the bending performance of the touch panel 1. The arrangement of the second touch metal layer 1212 between the first touch metal layer 1211 and the touch substrate 11 allows the second touch metal layer 1212 to be closer to the neutral layer, to reduce the effect of the second touch metal layer 1212 on the bending performance of the touch panel 1, thereby facilitating improving the bending performance of the touch panel 1.

Figure 14:
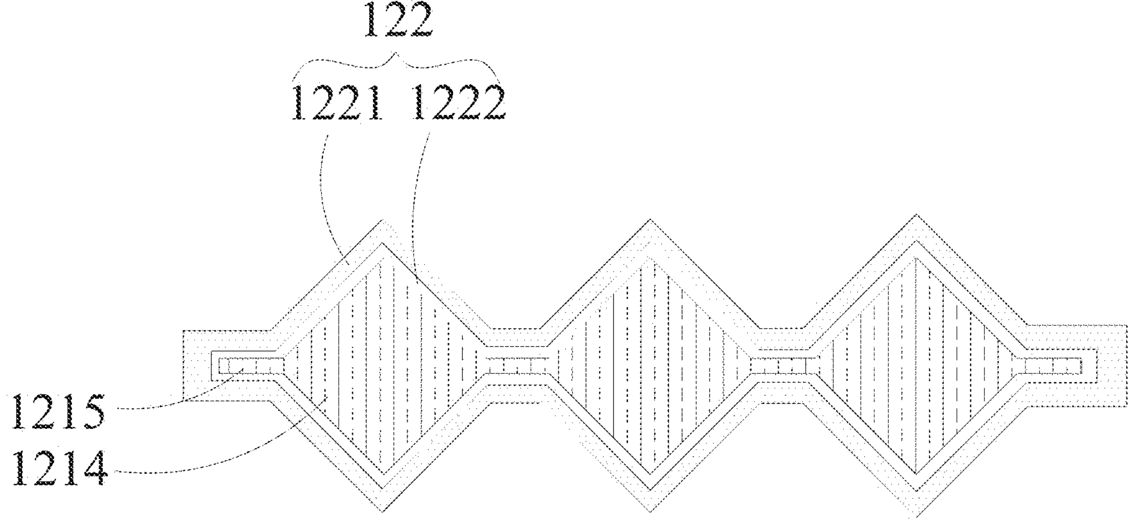
FIG. 14 shows a partial schematic view of a touch panel according to embodiments of the present application.
Figure 15:
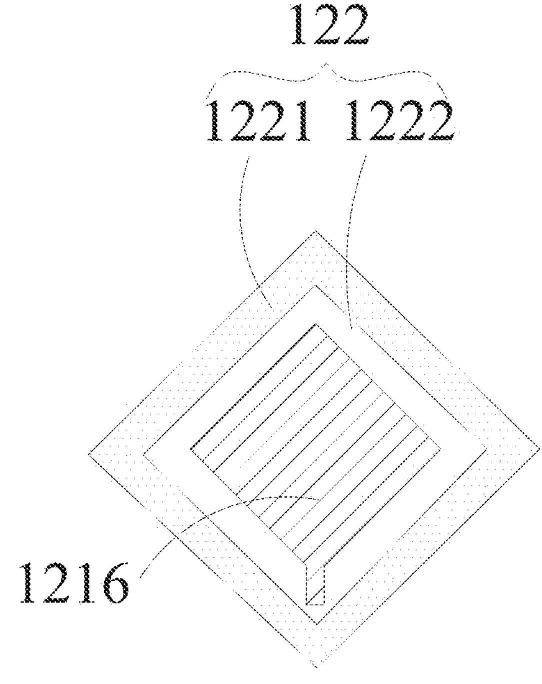
FIG. 15 shows a partial schematic view of a touch panel according to embodiments of the present application.

In one embodiment, as shown in FIGS. 14 and 15, the at least an opening portion 1222 includes a plurality of opening portions 1222, and the opening portions 1222 are spaced apart and independent from each other.

In the above implementation, the opening portions 1222 are spaced apart and independent from each other, and particularly, the opening portion 1222 may expose the second touch wiring 1215 or the second touch electrode 1214. Since the second touch electrodes 1214 adjacent along the row direction are electrically connected through the second touch wiring 1215, therefore as shown in FIG. 14, some of the opening portions 1222 may expose both the second touch electrodes 1214 and the second touch wiring 1215 disposed in the row direction for ease of preparation. As shown in FIG. 15, some other of the opening portions 1222 may correspond to the first touch electrodes 1213 in one-to-one correspondence, and expose the corresponding first touch electrodes 1213, respectively.

In another possible implementation, as shown in FIGS. 8 and 9, the opening portions 1222 are arranged continuously as a whole.

In the above implementation, the opening portions 1222 are arranged continuously as a whole in the display area.

Specifically, the opening portion 1222 may expose the first touch electrodes 1213, the second touch electrodes 1214, and the second touch wiring 1215 at the same time, thereby forming the opening portion 1222 arranged continuously as a whole.

Specifically, the first touch metal layer 1211 and the second touch metal layer 1212 include a metal material, and particularly, the first touch metal layer 1211 and the second touch metal layer 1212 may include a titanium metal layer 211, an aluminum metal layer 211, and a titanium metal layer 211 which are stacked along a direction away from the touch substrate 11, or may be ITO, which is not limited in the present application.

In one embodiment, as shown in FIG. 13, a first isolating layer 14 is located between the first touch metal layer 1211 and the second touch metal layer 1212, an orthographic projection of the first isolating layer 14 on the touch substrate 11 covers an orthographic projection of the first touch metal layer 1211 on the touch substrate 11, to achieve mutual insulation between the first touch metal layer 1211 and the second touch metal layer 1212.

Specifically, the first isolating layer 14 may include an organic material or an inorganic material, which is not limited in the present application.

Figure 16:
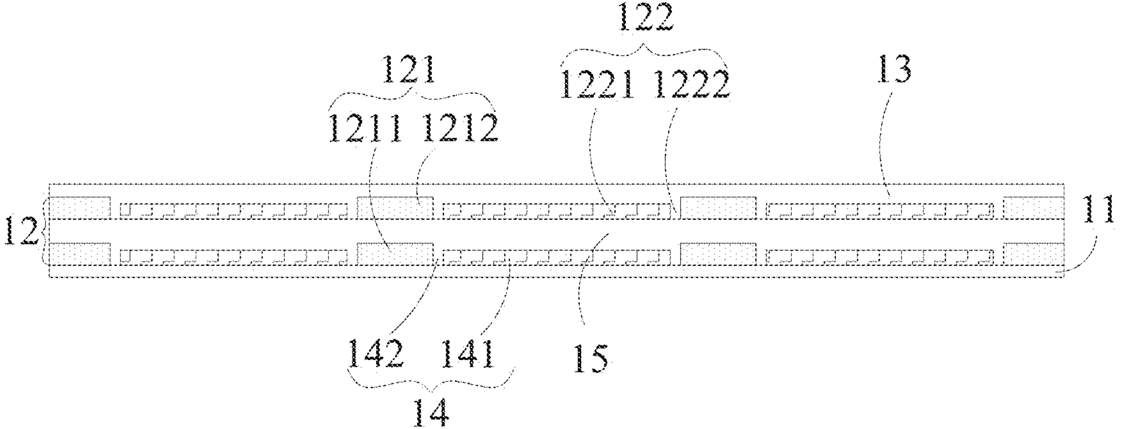
FIG. 16 shows another sectional view along N-N' in FIG. 1.

In one embodiment, as shown in FIG. 16, a first isolating layer 14 and a second isolating layer 15 are located between the first touch metal layer 1211 and the second touch metal layer 1212 which are stacked in sequence at one side of the touch substrate 11, the first isolating layer 14 includes a solid area 141 and a hole area 142, the solid area 141 is located in the same layer as the first touch metal layer 1211, or the solid area 141 is located at a side of the first touch metal layer 1211 away from the touch substrate 11, the hole area 142 exposes at least a portion of the first touch metal layer 1211, the second isolating layer 15 is located at a side of the first isolating layer 14 away from the touch substrate 11, and a projection of the second isolating layer 15 on the touch substrate 11 at least covers a projection of the hole area 142 on the touch substrate 11, to isolate the first touch metal layer 1211 and the second touch metal layer 1212.

In one embodiment, the first isolating layer 14 includes an inorganic material, and the second isolating layer 15 includes an organic material.

In the above implementation, as shown in FIG. 16, the first isolating layer 14 is patterned to obtain the solid area 141 and the hole area 142. Specifically, the first isolating layer 14 may include a plurality of solid areas 141 which are spaced apart and located in the same layer as the first touch metal layer 1211, an orthographic projection of the solid area 141 on the touch substrate 11 is separated from an orthographic projection of the first touch metal layer 1211 on the touch substrate 11, and the hole area 142 is located between adjacent solid areas 141. In such cases, the hole area 142 completely exposes the first touch metal layer 1211, and the solid area 141 is not in contact with the first touch metal layer 1211, thereby preventing, when the touch panel 1 is bent by a force, the adverse effect of the stress difference in the portion of the solid area 141 in contact with the first touch metal layer 1211 on the bending performance of the touch panel 1, and facilitating improving the bending performance and yield of the touch panel 1. Moreover, the first isolating layer 14 may provide insulating function along a direction parallel to the plane in which the touch substrate 11 is located.

Figure 17:
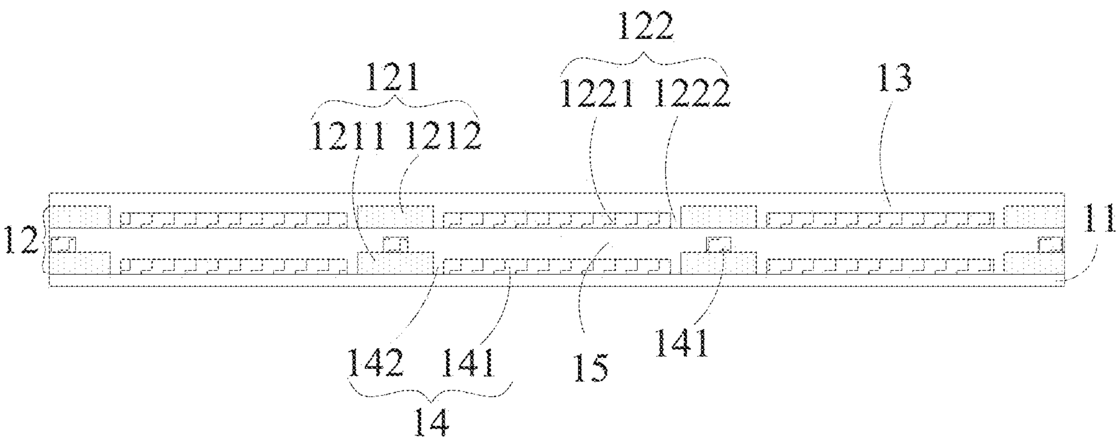
FIG. 17 shows another sectional view along N-N' in FIG. 1.

In one embodiment, as shown in FIG. 17, the solid area 141 includes a portion located in the same layer as the first touch metal layer 1211 and a portion located at a side of the first touch metal layer 1211 away from the touch substrate 11, and the hole area 142 is formed in an area corresponding to the portion of the solid area 141 located at the side of the first touch metal layer 1211 away from the touch substrate 11. In such cases, the hole area 142 exposes a portion of the first touch metal layer 1211, and the provision of the hole area 142 may reduce the contact area between the solid area 141 and the first touch metal layer 1211, thereby reducing, when the touch panel 1 is bent by a force, the adverse effect of the stress difference in the portion of the solid area 141 in contact with the first touch metal layer 1211 on the bending performance of the touch panel 1, and facilitating improving the bending performance and yield of the touch panel 1. Moreover, the first isolating layer 14 may provide insulating function along a direction parallel to the plane in which the touch substrate 11 is located.

Figure 18:
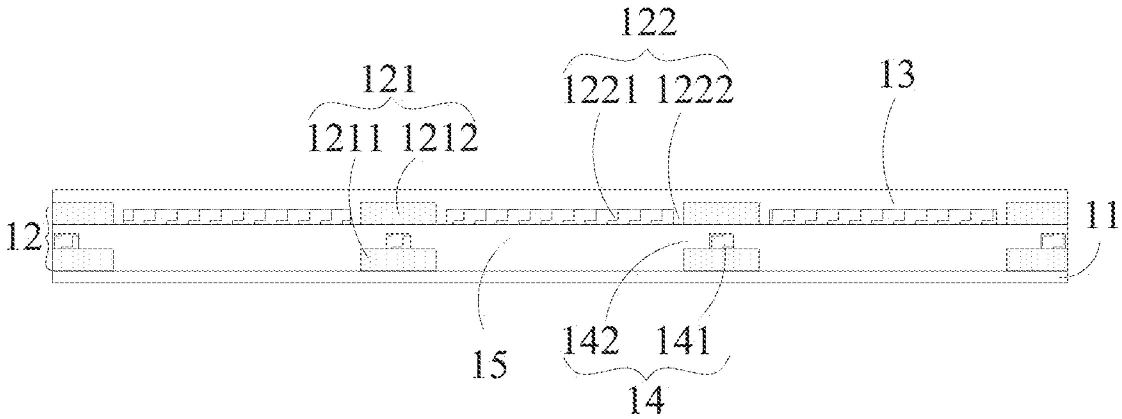
FIG. 18 shows another sectional view along N-N' in FIG. 1.

In one embodiment, as shown in FIG. 18, the solid area 141 includes only a portion located at a side of the first touch metal layer 1211 away from the touch substrate 11. In such cases, the solid area 141 is in contact with the first touch metal layer 1211, but the hole area 142 exposes at least a portion of the first touch metal layer 1211, to reduce the contact area between the solid area 141 and the first touch metal layer 1211, thereby reducing, when the touch panel 1 is bent by a force, the adverse effect of the stress difference in the portion of the solid area 141 in contact with the first touch metal layer 1211 on the bending performance of the touch panel 1, and facilitating improving the bending performance and yield of the touch panel 1.

In the above implementation, the first isolating layer 14 includes an inorganic material of good supporting and insulating performance, which may good support the second touch metal layer 1212.

In the above implementation, as shown in FIG. 18, the projection of the second isolating layer 15 on the touch substrate 11 covers the projection of the hole area 142 on the touch substrate 11, and the hole area 142 is filled by the second isolating layer 15. On the one hand, planarization is achieved, and on the other hand, if the orthographic projection of the hole area 142 on the touch substrate 11 overlaps the orthographic projection of the first touch metal layer 1211 on the touch substrate 11, covering and filling the hole area 142 with the second isolating layer 15 may provide auxiliary insulating effect.

In the above implementation, the second isolating layer 15 is located at and in contact with the side of the first isolating layer 14 away from the touch substrate 11. In such cases, the second isolating layer 15 may mainly provide the planarization function, and also the insulating and protecting function.

In one embodiment, the second isolating layer 15 is located at and in contact with the side of the first touch metal layer 1211 away from the touch substrate 11. In such cases, the second isolating layer 15 may mainly provide the insulating function.

In one embodiment, a portion of the second isolating layer 15 is located at the side of the first isolating layer 14 away from the touch substrate 11, and another portion of the second isolating layer 15 is located at the side of the first touch metal layer 1211 away from the touch substrate 11. In such cases, the second isolating layer 15 may provide the planarization and insulating function.

In the above implementation, the second isolating layer 15 includes an organic material which has good flexibility and ductility, and filling the hole area 142 with the organic material for direct contact with the first touch metal layer 1211 can reduce the adverse effect of the stress difference between the hole area 142 and the first touch metal layer 1211 in the bending process on the bending performance. Moreover, the use of the organic material may provide good planarization function to facilitate the preparation of subsequent film layers.

Figure 19:
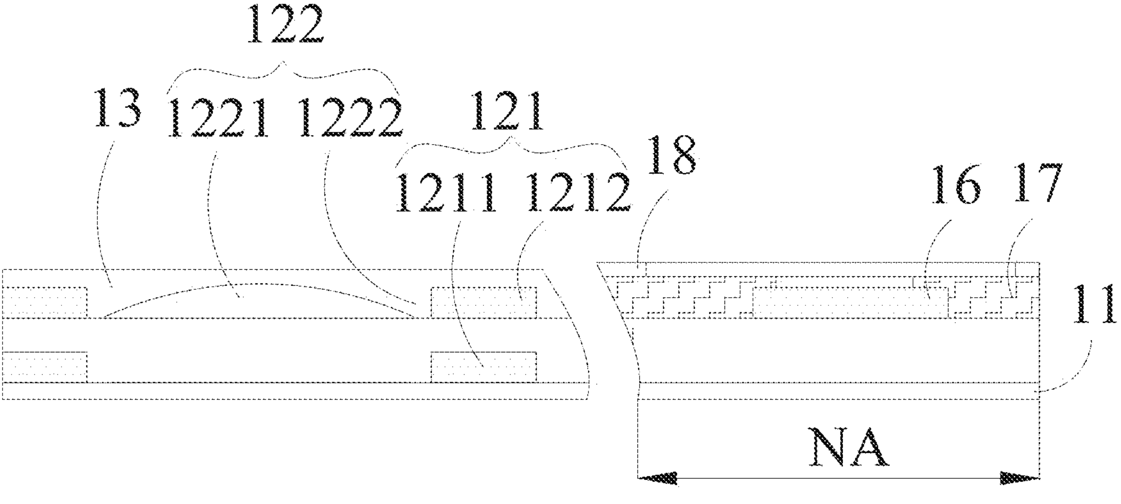
FIG. 19 shows a sectional view along M-M' in FIG. 1.

In one embodiment, as shown in FIGS. 1 and 19, the touch panel 1 includes a binding area, and the binding area includes a binding pad 16 electrically connected with the touch metal layer 121. The binding pad 16 is configured to bind to a chip to achieve the electrical connection between the touch metal layer 121 and the chip, thereby achieving the touch control function.

Figure 20:
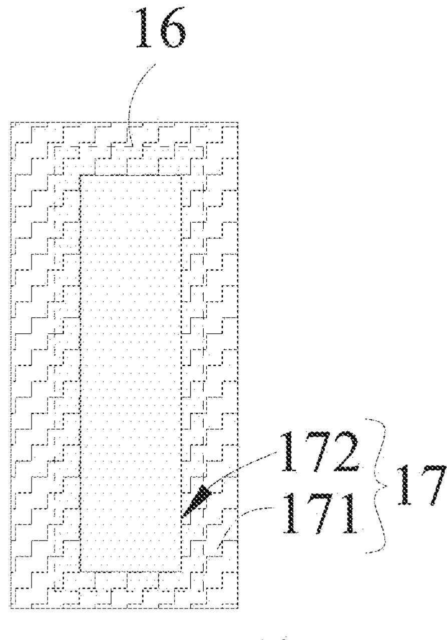
FIG. 20 shows a partially enlarged view of area C in FIG. 1.

In one embodiment, as shown in FIGS. 19 and 20, the binding pad 16 has a separating layer 17 provided at a side thereof away from the touch substrate 11, the separating layer 17 includes a separating body 171 and a hole 172, the hole 172 is encircled and formed by the separating body 171, and an orthographic projection of the hole 172 on the touch substrate 11 is located within an orthographic projection of the binding pad 16 on the touch substrate 11.

In the above implementation, the binding area further includes the separating layer 17 which is located at the side of the binding pad 16 away from the touch substrate 11 and includes the separating body 171 and the hole 172. The orthographic projection of the hole 172 on the touch substrate 11 is located within the orthographic projection of the binding pad 16 on the touch substrate 11, and the edges of these two orthographic projections are separated, i.e., the area of the orthographic projection of the hole 172 on the touch substrate 11 is less than the area of the orthographic projection of the binding pad 16 on the touch substrate 11. Specifically, the hole 172 exposes a portion, such as the center area, of the binding pad 16 to facilitate binding the binding pad 16 to other components. The orthographic projection of the separating body 171 on the touch substrate 11 may cover the edge area of the orthographic projection of the binding pad 16 on the touch substrate 11, which may reduce the adverse effect of subsequent processing on the binding pad 16, thereby protecting the binding pad 16. Specifically, the binding pad 16 may include a titanium metal layer 211, an aluminum metal layer 211, and a titanium metal layer 211 that are stacked, and in etching a film layer at the side of the binding pad 16 away from the touch substrate 11, over-etching is likely to occur and the titanium metal layer 211 is partially etched, and thus the aluminum metal layer 211 is exposed, causing that the binding pad 16 is likely to be oxidized and the binding impedance of the binding pad 16 after binding to other components is too great, and thus the quality of the produce is poor. By covering the edge of the binding pad 16 with the separating body 171, the binding pad 16 is protected, and thus edge exposure, oxidization, and other defects of the binding pad 16 may be reduced, thereby alleviating the problem of high impedance. Moreover, since the hole 172 exposes the binding pad 16, the adverse effect on the alignment accuracy of electrical connection of the binding pad 16 may be reduced to a certain extent. In other words, the alignment accuracy of electrical connection of the binding pad 16 is maintained while the binding pad 16 is protected.

In one embodiment, as shown in FIG. 19, the binding pad 16 is arranged in the same layer as the second touch metal layer 1212. Moreover, the binding pad 16 and the second touch metal layer 1212 may be prepared simultaneously using the same metal layer.

In the above implementation, the binding pad 16 is arranged in the same layer as the second touch metal layer 1212, no additional film layer for preparing the binding pad 16 is needed, and the preparation process may be simplified. Moreover, if the structure in which the binding pad 16 is arranged in the same layer as the second touch metal layer 1212 is adopted, the segment difference between the binding area and the other areas is small, the thickness of the sidewalls at two sides of the hole 172 over the binding pad 16 may be reduced, and thus it is easier for other components to bind to the binding pad 16, which facilitates improving the stability and reliability of the binding. In addition, the number of film layers at the side of the binding pad 16 away from the touch substrate 11 is less, which may reduce the effect of the step for etching the film layers at the side of the binding pad 16 away from the touch substrate 11 to expose the binding pad 16 on the yield of the binding pad 16.

Figure 21:
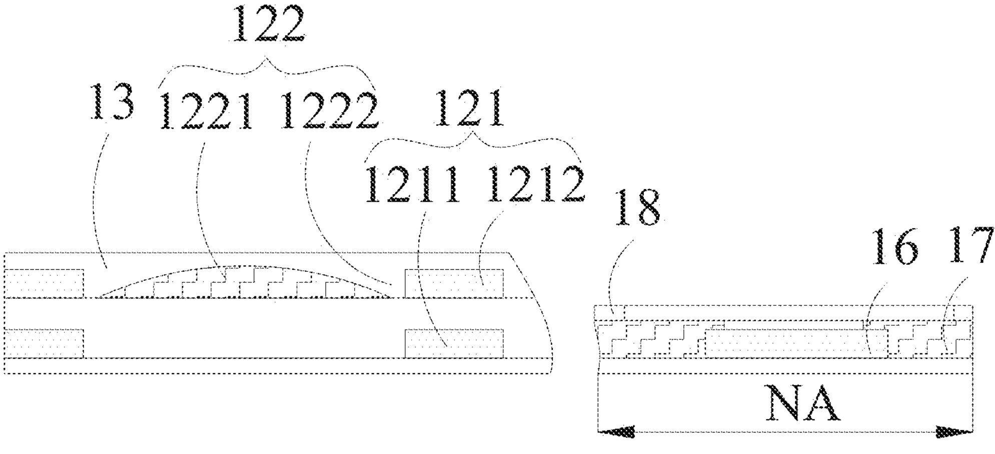
FIG. 21 shows a sectional view along M-M' in FIG. 1.

In another possible implementation, as shown in FIG. 21, the binding pad 16 is arranged in the same layer as the first touch metal layer 1211.

In the above implementation, the binding pad 16 is arranged in the same layer as the first touch metal layer 1211, no additional film layer for preparing the binding pad 16 is needed, and the preparation process may be simplified. Moreover, the thickness of the sidewalls at two sides of the hole 172 is less, and thus it is easier for other components to bind to the binding pad 16, which facilitates improving the stability and reliability of the binding.

In one embodiment, the separating layer 17 is arranged in the same layer as the insulating layer 122. Different patterns may be formed in the binding area and other areas through patterning after a material layer is formed, to form the separating layer 17 in the binding area and the insulating layer 122 in other areas, thereby reducing the number of film layers to be prepared to save the preparation cost.

Figure 22:
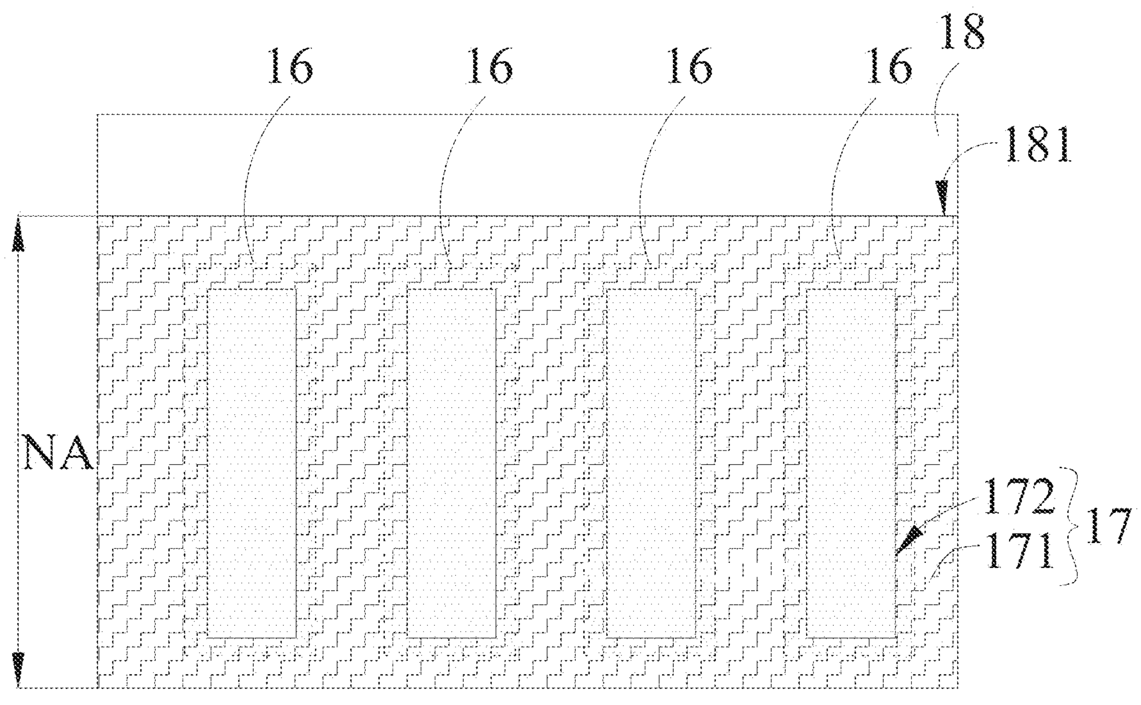
FIG. 22 shows a schematic structural diagram of a binding area of a touch panel according to embodiments of the present application.

In one embodiment, as shown in FIGS. 20, 21, and 22, the touch panel 1 further includes a defending layer 18 located at a side of the separating layer 17 away from the touch substrate 11 and a protective layer 13 located at a side of the touch layer 12 away from the touch substrate 11, the defending layer 18 is arranged in the same layer with the protective layer 13, and an orthographic projection of the defending layer 18 on the touch substrate 11 is separated from the orthographic projection of the hole 172 on the touch substrate 11.

Different patterns may be formed in the binding area and other areas through patterning after a material layer is formed, to form the defending layer 18 in the binding area and the protective layer 13 in other areas, thereby reducing the number of film layers to be prepared to save the preparation cost.

The orthographic projection of the defending layer 18 on the touch substrate 11 is separated from the orthographic projection of the hole 172 on the touch substrate 11 to avoid blocking the center area of the binding pad 16, thereby avoiding interference with the binding.

In one embodiment, as shown in FIG. 22, the binding area includes two or more binding pads 16, the defending layer 18 includes one through hole 181, and orthographic projections of the two or more binding pads 16 on the touch substrate 11 are located within an orthographic projection of the through hole 181 on the touch substrate 11, i.e., the orthographic projection of each of the binding pads 16 on the touch substrate 11 is located within the orthographic projection of the through hole 181 on the touch substrate 11.

In the above implementation, the defending layer 18 includes a large through hole 181 located in the binding area, and this through hole 181 exposes all holes 172, i.e., the orthographic projection of each of the holes 172 on the touch substrate 11 is located within the orthographic projection of the through hole 181 on the touch substrate 11. On the one hand, the defending layer 18 may be prevented from blocking the hole 172, which otherwise affects the binding, and on the other hand, the thickness of the sidewalls of the hole 172 may be reduced, thereby reducing the difficulty of binding. Moreover, since the defending layer 18 includes a large through hole 181 within which an area that is no longer affected by the material of the defending layer 18 may be formed, it may be avoided that the defending layer 18 includes a small through hole 181 and thus includes a portion located between adjacent holes 172, this portion presents, after being adversely affected by subsequent processing, melting, forming residues which fall into the hole 172, and other defects, which adversely affect the binding. The main reason for the above problems is that the binding pad 16 needs to be hot-pressed in the binding process.

In other embodiments, the defending layer 18 is provided with a plurality of through holes 181, each of which corresponds to a plurality of binding pads 16.

Figure 23:
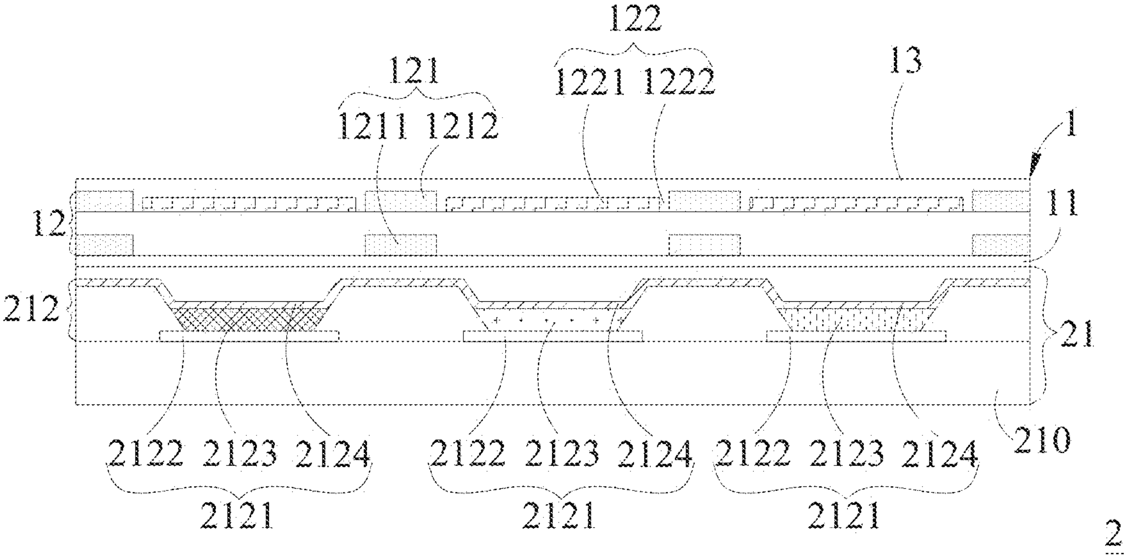
FIG. 23 shows a schematic structural diagram of a display module according to embodiments of the present application.

The present application further provides a display module 2, as shown in FIG. 23, including any touch panel 1 provided in the present application.

Since the display module 2 provided in the present application includes any touch panel 1 provided in the above implementations, the display module 2 provided in the present application has the beneficial effects of any touch panel 1 provided in the above implementations, which will not be repeated herein.

Figure 24:
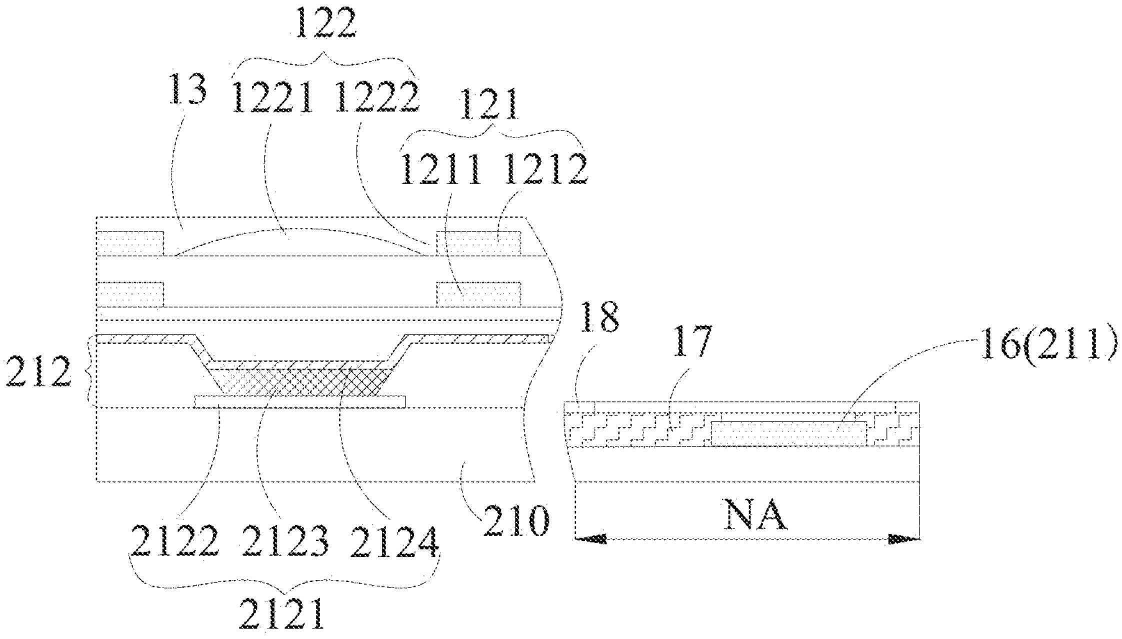
FIG. 24 shows a partial sectional view of a display module according to embodiments of the present application.

The display module 2 provided in the present application further includes a display panel 21, as shown in FIG. 24, located at one side of the touch panel 1. The display panel 21 includes an array base plate 210, the array base plate 210 includes a metal layer 211, the touch panel 1 includes a binding pad 16, and the binding pad 16 is arranged in the same layer as the metal layer 211, that is, the binding pad 16 may be prepared simultaneously with the metal layer 211, no additional film layer is needed, and the preparation process may be simplified.

Specifically, the array base plate 210 includes a substrate and a first metal layer 211, a second metal layer 211, a third metal layer 211, and a fourth metal layer 211 arranged in sequence in a direction away from the substrate, wherein the first metal layer 211 is used to form a gate of a transistor and a lower electrode plate of a capacitor, the second metal layer 211 is used to form an upper electrode plate of the capacitor, the third metal layer 211 is used to form a source/drain of the transistor, and the fourth metal layer 211 is used to form a signal line, and the like. The array base plate 210 may also be a structure including more metal layers 211, which is not limited in this application. The binding pad 16 may be arranged in the same layer as any of the first metal layer 211, the second metal layer 211, the third metal layer 211, and the fourth metal layer 211.

If the binding pad 16 is arranged in the same layer as the fourth metal layer 211, the thickness of the sidewalls around the hole 172 is less, and thus it is easier to electrically connect the binding pad 16 to other components.

In the above implementation, the binding pad 16 includes a binding pad 16 for electrically connecting the touch layer 12 to a chip, and a binding pad 16 for connecting the display panel 21 to a chip. The binding pad 16 may include some or all of a driver chip binding pad 16, a flexible circuit board binding pad 16, and a CT binding pad 16.

In one embodiment, as shown in FIG. 24, the display panel 21 further includes a light-emitting layer 212 located between the array base plate 210 and the touch panel 1 and including a plurality of light-emitting units 2121, the touch panel 1 includes a touch layer 12, the touch layer 12 includes a touch metal layer 121 and an insulating layer 122, the insulating layer 122 includes a body portion 1221 and at least an opening portion 1222, and an orthographic projection of the body portion 1221 on the array base plate 210 at least partially overlaps an orthographic projection of the light-emitting unit 2121 on the array base plate 210.

The body portion 1221 may serve to adjust the light emitted by the light-emitting unit 2121. Specifically, the orthographic projection of the body portion 1221 on the array base plate 210 at least partially overlaps the orthographic projection of the light-emitting unit 2121 on the array base plate 210. The body portion 1221 includes the first cross-section Q in the direction perpendicular to the plane in which the touch substrate 11 is located, the first cross-section Q is a trapezoid in shape, or the edge of the first cross-section Q at the side away from the touch substrate 11 is an arc in shape, and the body portion 1221 may be formed as a convex lens structure to concentrate light and further increase the light exitance along the direction perpendicular to the plane in which the touch substrate 11 is located, and thus a portion of the large-angle lights may be emitted, after being concentrated, along the direction perpendicular to the plane in which the touch substrate 11 is located, to increase the exitance of the light emitted by the light-emitting unit 2121, thereby reducing the power consumption of the display panel 21.

In addition, the protective layer 13 is arranged at a side of the body portion 1221 away from the display panel 21, and the refractive index of the body portion 1221 is greater than the refractive index of the protective layer 13 to ensure the light concentrating effect, to increase the exitance of front view lights and reduce the exitance of large-angle lights for the display panel 21, which facilitates achieving anti-peeping function. For example, in some embodiments, the body portion 1221 is prepared using silicon nitride ($SiN_x$), and its refractive index may be 1.8, or the refractive index may be greater than 1.5; the protective layer 13 is made of photoresist (OC), and its refractive index is 1.5, or the refractive index is less than 1.5.

Figure 25:
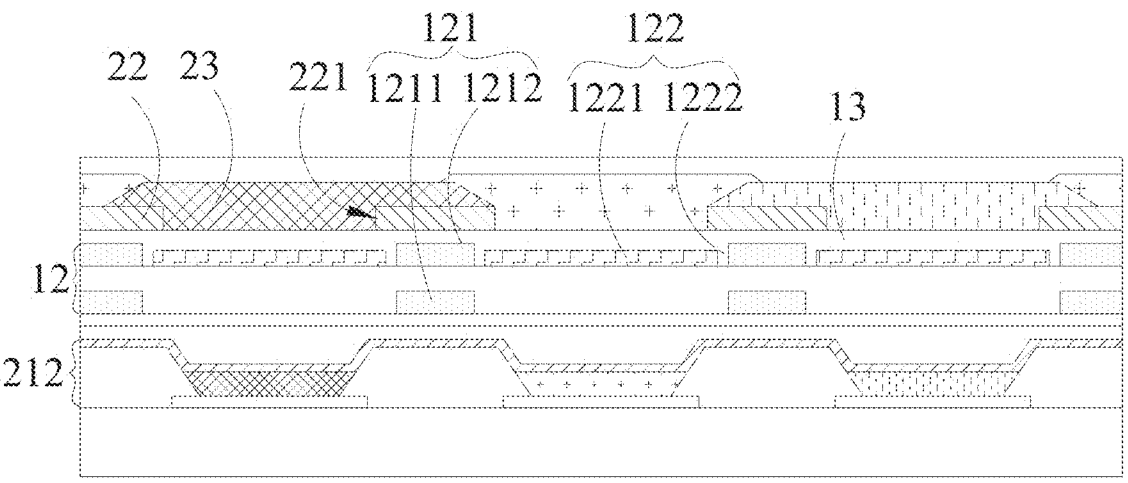
FIG. 25 shows a partial sectional view of a display module according to embodiments of the present application.

In one embodiment, as shown in FIG. 25, the display module 2 further includes a shading layer 22 and a color filtering portion 23 formed at a side of the touch panel 1 away from the display panel 21, the shading layer 22 is provided with a plurality of through holes 221, an orthographic projection of the through hole 221 on the array base plate 210 at least partially overlaps an orthographic projection of the light-emitting unit 2121 on the array base plate 210, and the color filtering portion 23 is located in the through hole 221 and may be in one-to-one correspondence with the through hole 221, for example, the orthographic projection of the color filtering portion 23 on the array base plate 210 covers the orthographic projection of the through hole 221 on the array base plate 210.

In the above implementation, the shading layer 22 and the color filtering portion 23 are utilized instead of a polarizer, and thus the display module 2 may be thinner and have better bending performance, while the excellent light transmittance of the color filtering portion 23 may reduce the power consumption of the display panel 21.

Specifically, in the above implementation, the color of the light emitted by the light-emitting unit 2121 covered by the orthographic projection of the color filtering portion 23 on the light-emitting layer 212 is the same as the color of the color filtering portion 23, to increase the purity of the emitted light.

The present application further provides a method for manufacturing a touch panel 1, including:

S100, providing a touch substrate 11; and

S200, forming a touch layer 12 at one side of the touch substrate 11, the touch layer 12 including a touch metal layer 121 and an insulating layer 122, the touch metal layer 121 being located at one side of the touch substrate 11, the insulating layer 122 including a body portion 1221 and at least an opening portion 1222, the body portion 1221 being located in the same layer as the touch metal layer 121, or the body portion 1221 being located at a side of the touch metal layer 121 away from the touch substrate 11, the opening portion 1222 exposing at least a portion of the touch metal layer 121.

Since the method for manufacturing a touch panel 1 provided in the present application is used to manufacture any touch panel 1 in the above implementations, the touch panel 1 manufactured using the method for manufacturing a touch panel 1 provided in the present application has the beneficial effects of any touch panel 1 provided in the above implementations, which will not be repeated herein.

In one embodiment, step S200 includes:

S201, forming a touch metal layer 121 at one side of the touch substrate 11; and

S202, forming an insulating layer 122 at one side of the touch substrate 11, the insulating layer 122 being arranged in the same layer as the touch metal layer 121, the insulating layer 122 includes body portions 1221 and opening portions 1222, the body portions 1221 being spaced apart, and the opening portion 1222 being located between adjacent body portions 1221, and an orthographic projection of the touch metal layer 121 on the touch substrate 11 being located within the opening portion 1222.

In the above implementation, the body portion 1221 of the insulating layer 122 is arranged in the same layer as the touch metal layer 121, and the insulating layer 122 may be not in contact with the touch metal layer 121, and thus the defects due to the large stress difference between the insulating layer 122 and the touch metal layer 121 in the bending process, under a condition that the insulating layer 122 is in contact with the touch metal layer 121, may be significantly reduced, to improve the bending performance of the display module 2.

In one embodiment, the touch panel 1 includes a binding area, a binding pad 16 is further formed at one side of the touch substrate 11, and the binding pad 16 is located in the binding area and arranged in the same layer as the touch metal layer 121.

In the above implementation, the binding pad 16 is arranged in the same layer as the second touch metal layer 1212, or the binding pad 16 is arranged in the same layer as the first touch metal layer 1211. No additional film layer for preparing the binding pad 16 is needed, the preparation process may be simplified, and moreover, the thickness of the sidewalls at two sides of the hole 172 may be less, and thus it is easier for other components to bind to the binding pad 16, which facilitates improving the stability and reliability of the binding.

In one embodiment, the forming the insulating layer 122 at one side of the touch substrate 11 includes: forming a layer of inorganic material at a side of the touch layer 12 away from the touch substrate 11 and patterning the layer of inorganic material to form the body portions 1221 that are spaced apart and arranged in the same layer as the touch metal layer 121 and at least an opening portion 1222 exposing the touch metal layer 121, and forming a separating layer 17 in the binding area including a separating body 171 and a hole 172, an orthographic projection of the hole 172 on the touch substrate 11 being located within an orthographic projection of the binding pad 16 on the touch substrate 11.

In the above implementation, the insulating layer 122 and the separating layer 17 are located in the same layer and may be prepared using the same preparation process, which specifically includes forming a layer of inorganic material at the side of the touch layer 12 away from the touch substrate 11 and patterning the layer of inorganic material, and thus another process for forming a layer of inorganic material may be omitted. Therefore, the preparation process may be saved, and the preparation cost may be reduced.

Figure 26:
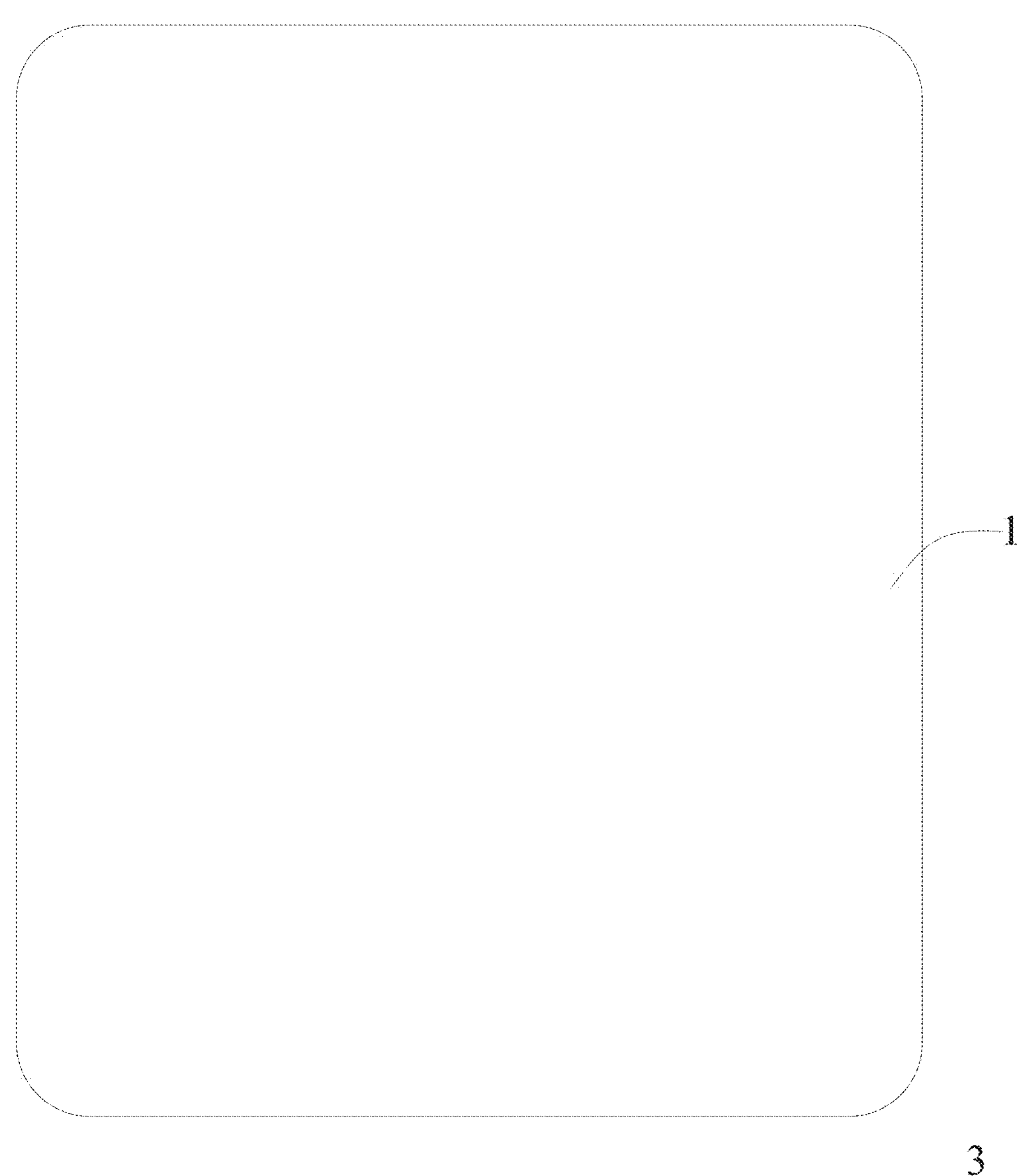
FIG. 26 shows a schematic structural diagram of a display apparatus according to embodiments of the present application.

The present application further provides a display apparatus 3, as shown in FIG. 26, including any touch panel 1 provided in the above implementations of the present application; or including any display module 2 provided in the above implementations of the present application; or including the touch panel 1 prepared by the above method.

Since the display apparatus 3 provided in the present application includes any touch panel 1 provided in the above implementations, or includes any display module 2 provided in the above implementations of the present application, or includes the touch panel 1 prepared by the above method, the display apparatus 3 provided in the present application has the beneficial effects of any touch panel 1 provided in the above implementations or any display module 2 provided in the above implementations, which will not be repeated herein.

The display apparatus 3 in the embodiments of the present application includes, but is not limited to, a cell phone, a Personal Digital Assistant (PDA), a tablet computer, an e-book, a television, a door access control, an intelligent landline phone, a console, and other devices with display function.

According to the above embodiments of the present application, these embodiments do not exhaustively describe all the details, nor do they limit the present application to the specific embodiments only. Obviously, many modifications and variations may be made in accordance with the above description. These embodiments are selected and specifically described in the specification for better explaining the principles and practical applications of the present application, and those skilled in the art can make good use of the present application and make modifications on the basis of the present application. The present application is limited only by the claims and their full scope and equivalents.

What is claimed is:

1. A touch panel, comprising:

a touch substrate;

a touch layer, comprising a touch metal layer and an insulating layer, the touch metal layer being located at one side of the touch substrate, and the insulating layer comprising a body portion and at least an opening portion;

the body portion being located in the same layer as the touch metal layer, or the body portion being located at a side of the touch metal layer away from the touch substrate; the opening portion exposing at least a portion of the touch metal layer, and a protective layer located at a side of the touch layer away from the touch substrate an orthographic projection of the protective layer on the touch substrate at least covering an orthographic projection of the touch metal layer on the touch substrate; the insulating layer comprising an inorganic material, and the protective layer comprising an organic material.

2. The touch panel according to claim 1, wherein the body portion is located in the same layer as the touch metal layer, and the orthographic projection of the protective layer on the touch substrate covers an orthographic projection of the touch layer on the touch substrate; the orthographic projection of the touch metal layer on the touch substrate is located within an orthographic projection of the opening portion on the touch substrate.

3. The touch panel according to claim 1, wherein the body portion comprises a first cross-section in a direction perpendicular to a plane in which the touch substrate is located, the first cross-section is a trapezoid in shape, or an edge of the first cross-section at a side away from the touch substrate is an arc in shape, and a refractive index of the body portion is greater than a refractive index of the protective layer.

4. The touch panel according to claim 1, wherein an orthographic projection of the body portion on the touch substrate is a circle or rectangular in shape; the body portion comprises a recess structure formed at a surface of the body portion at a side away from the touch substrate, and the protective layer extends into the recess structure.

5. The touch panel according to claim 1, wherein the opening portion exposes at least an edge of the touch metal layer.

6. The touch panel according to claim 5, wherein the touch metal layer is a first touch metal layer; or the touch metal layer comprises a first touch metal layer and a second touch metal layer, the first touch metal layer comprises a first touch wiring, the second touch metal layer comprises a plurality of first touch electrodes, a plurality of second touch electrodes, and a second touch wiring, the first touch electrodes are distributed in rows and columns, the first touch electrodes adjacent along a column direction are electrically connected through the first touch wiring, and the second touch electrodes are distributed in rows and columns, the second touch electrodes adjacent along a row direction are electrically connected through the second touch wiring;

wherein the second touch metal layer is located at a side of the first touch metal layer away from the touch substrate, the opening portion exposes at least an edge of the second touch metal layer, or the first touch metal layer is located at a side of the second touch metal layer away from the touch substrate, the opening portion exposes at least an edge of the first touch metal layer.

7. The touch panel according to claim 5, wherein the at least an opening portion comprises a plurality of opening portions, the opening portions are spaced apart and independent from each other, or the opening portions are arranged continuously as a whole.

8. The touch panel according to claim 5, wherein the touch metal layer comprises a first touch metal layer and a second touch metal layer stacked in sequence at one side of the touch substrate, and a first isolating layer located between the first touch metal layer and the second touch metal layer, an orthographic projection of the first isolating layer on the touch substrate covers an orthographic projection of the first touch metal layer on the touch substrate; or the touch metal layer comprises a first touch metal layer and a second touch metal layer stacked in sequence at one side of the touch substrate, and a first isolating layer and a second isolating layer located between the first touch metal layer and the second touch metal layer, the first isolating layer comprises a solid area and a hole area, the solid area is located in the same layer as the first touch metal layer, or the solid area is located at a side of the first touch metal layer away from the touch substrate, the hole area exposes at least a portion of the first touch metal layer, the second isolating layer is located at a side of the first isolating layer away from the touch substrate, and a projection of the second isolating layer on the touch substrate at least covers a projection of the hole area on the touch substrate;

wherein the first isolating layer comprises an inorganic material, and the second isolating layer comprises an organic material; and the solid area exposes at least an edge of the first touch metal layer.

9. The touch panel according to claim 1, wherein the touch panel comprises a binding area, and the binding area comprises a binding pad electrically connected with the touch metal layer; and the binding pad has a separating layer provided at a side thereof away from the touch substrate, the separating layer comprises a separating body and a hole, the hole is encircled and formed by the separating body, and an orthographic projection of the hole on the touch substrate is located within an orthographic projection of the binding pad on the touch substrate.

10. The touch panel according to claim 9, wherein the binding pad is arranged in the same layer as the touch metal layer; the separating layer is arranged in the same layer as the insulating layer; and the separating layer comprises an inorganic material.

11. The touch panel according to claim 9, wherein the touch panel further comprises a defending layer located at a side of the separating layer away from the touch substrate, an orthographic projection of the defending layer on the touch substrate is separated from the orthographic projection of the hole on the touch substrate; the touch panel further comprises a protective layer located at a side of the touch layer away from the touch substrate, and the defending layer is arranged in the same layer with the protective layer.

12. The touch panel according to claim 11, wherein the binding area comprises two or more binding pads, the defending layer comprises one through hole, and orthographic projections of the two or more binding pads on the touch substrate are located within an orthographic projection of the through hole on the touch substrate.

13. A display module comprising:

a touch panel comprising:

a touch substrate:

a touch layer, comprising a touch metal layer and an insulating layer, the touch metal layer being located at one side of the touch substrate, and the insulating layer comprising a body portion and at least an opening portion;

the body portion being located in the same layer as the touch metal layer, or the body portion being located at a side of the touch metal layer away from the touch substrate;

the opening portion exposing at least a portion of the touch metal layer; and a display panel located at one side of the touch panel, the display panel comprising an array base plate, the array base comprising a metal layer, the touch panel comprising a binding pad, and the binding pad being arranged in the same layer as the metal layer.

14. The display module according to claim 13, wherein the display panel further comprises a light-emitting layer located between the array base plate and the touch panel, and comprising a plurality of light-emitting units, the touch panel comprises a touch layer, the touch layer comprises a touch metal layer and an insulating layer, the insulating layer comprises a body portion and at least an opening portion, and an orthographic projection of the body portion on the array base plate at least partially overlaps an orthographic projection of the light-emitting unit on the array base plate.

15. The display module according to claim 14, further comprising a shading layer and a color filtering portion formed at a side of the touch panel away from the display panel, the shading layer being provided with a plurality of through holes, an orthographic projection of a through hole on the array base plate at least partially overlaps an orthographic projection of the light-emitting unit on the array base plate, and the color filtering portion being arranged in the through hole.

16. A method for manufacturing a touch panel, comprising:

providing a touch substrate;

forming a touch layer at one side of the touch substrate, the touch layer comprising a touch metal layer and an insulating layer, the touch metal layer being located at one side of the touch substrate, the insulating layer comprising a body portion and at least an opening portion, the body portion being located in the same layer as the touch metal layer, or the body portion being located at a side of the touch metal layer away from the touch substrate, the opening portion exposing at least a portion of the touch metal layer, forming a touch metal layer at one side of the touch substrate; and forming an insulating layer at one side of the touch substrate, the insulating layer being arranged in the same layer as the touch metal layer, the insulating layer comprising a body portion and at least an opening portion, and an orthographic projection of the touch metal layer on the touch substrate being located within an orthographic projection of the opening portion on the touch substrate.

17. The method according to claim 16, wherein the touch panel comprises a binding area, a binding pad is formed at one side of the touch substrate, the binding pad is located in the binding area and electrically connected with the touch metal layer, and the binding pad and the touch metal layer are formed simultaneously; and the forming the insulating layer at one side of the touch substrate comprises:

forming a layer of inorganic material at a side of the touch layer away from the touch substrate and patterning the layer of inorganic material to form a body portion arranged in the same layer as the touch metal layer and at least an opening portion exposing the touch metal layer, and forming a separating layer in the binding area comprising a separating body and a hole, an orthographic projection of the hole on the touch substrate being located within an orthographic projection of the binding pad on the touch substrate.

* * * * *